SEMICONDUCTOR DEVICES

Filed Oct. 16, 1953 2 Sheets-Sheet 1

INVENTORS: W. H. BRATTAIN
C. G. B. GARRETT

BY [signature]

ATTORNEY

Jan. 20, 1959 W. H. BRATTAIN ET AL 2,870,344

SEMICONDUCTOR DEVICES

Filed Oct. 16, 1953 2 Sheets-Sheet 2

INVENTORS: W. H. BRATTAIN
C. G. B. GARRETT

BY [signature]

ATTORNEY

United States Patent Office 2,870,344

Patented Jan. 20, 1959

2,870,344

SEMICONDUCTOR DEVICES

Walter H. Brattain, Chatham, and Charles G. B. Garrett, Morristown, N. J., assignors to Bell Telephone Laboratories, Incorporated, New York, N. Y., a corporation of New York Application October 16, 1953, Serial No. 386,580

21 Claims. (Cl. 307—88.5)

This invention relates to semiconductor devices and more particularly to such devices for generating, amplifying or otherwise translating electrical signals.

One type of semiconductor translating device, designated the transistor, comprises, in one form, a body of semiconductive material, such as silicon or germanium, having three connections thereto termed the base, the emitter and the collector. Usually, the base connection is substantially ohmic and the emitter and collector are rectifying. Typical transistor structures are disclosed in Patent 2,524,035, granted October 3, 1950 to J. Bardeen and W. H. Brattain.

Generally, as disclosed in detail in the patent identified, in operation the emitter is biased in the forward, or low resistance, direction and the collector is biased in the reverse, or high resistance, direction. The physics of transistor action involves modulation of the minority carrier concentration in the semiconductor, for example by injection of minority carriers into the semiconductor at the emitter, and flow of minority carriers to, and collection thereof at the collector. For example, if the bulk of the semiconductive body is of N conductivity type, the majority carriers therein are electrons. Holes, minority carriers, may be injected at the emitter and flow to and collected by the collector. If the body is of P type material, the minority carriers are electrons. Minority carrier modulation may be effected also by a depletion process, for example withdrawal of such carriers from the semiconductor.

In transistors of the type disclosed in the patent aforementioned, the connections are metallic. The effectiveness of transistor action realizable is dependent in large measure upon the characteristics of the metal-semiconductor interfaces. For example, the collector electrode-semiconductor interface must define a rectifying junction and such as is capable of collecting the minority carriers flowing thereto. Attainment of the desired characteristics may involve particular chemical treatment of the semiconductor surface, electrical treatment of the collector-body junction, or other practices.

Further, the energy necessary for the achievement of gain is derived from sources external to and separate from the semiconductor and the connections thereto.

One general object of this invention is to provide a new class of semiconductor signal translating devices.

A more specific object of this invention is to obviate the necessity for sources of energy separate from such devices or, stated in another way, to provide a self-powered signal translating device.

Another specific object of this invention is to enable realization of novel and advantageous performance characteristics for semiconductor translating devices.

The invention is predicated in part upon the discovery that an interface characteristic advantageously useful for the collection of minority carriers in a semiconductor, for example of carriers injected into the semiconductor, or for modulation of the minority carrier density in a semiconductor can be realized between an electronic semiconductor and an electrolyte.

In accordance with one feature of this invention, in a semiconductive signal translating device, an electrolyte and an electrode immersed therein are provided in association with one or more portions of the semiconductor body to define with said portion or portions a junction or junctions capable of effecting efficient collection of minority carriers in or injected into the body, or modulating the minority carrier density in the body.

In accordance with another feature of this invention, the body, electrolyte and associated electrode are correlated to define a primary electromotive force source of the polarity to effect the desired function, i. e., collection or modulation, of the junction.

In one illustrative embodiment of this invention, a translating device comprises a body of semiconductive material, such as germanium or silicon, a substantially ohmic base connection to the body, means for effecting minority carrier modulation, for example an emitter connection for injecting minority carriers into the semiconductor, and an electrode spaced from the body which together with the semiconductor and an interposed electrolyte defines a primary cell of polarity such as to make minority carriers flow toward the semiconductor-electrolyte interface.

The electrolyte is one which forms a rectifying junction at the surface of the semiconductor and the electrode is of a material reversible with respect to the electrolyte and has a half potential lower or higher, depending upon the conductivity type of the semiconductor, than that at which the semiconductor passes into solution in the electrolyte. In one particular combination, wherein the body is of N type germanium, an electrolyte of aqueous potassium hydroxide, for example a decinormal solution, and an electrode of silver-silver oxide may be employed. When the germanium and electrode are connected a potential is developed across the cell. The internal electromotive force of the cell is of the order of one volt. The current through the cell is in such sense as to bias the germanium surface anodically.

Nominally, the maximum current which can flow through the cell is the reverse saturation current of the rectifying junction defined at the semiconductor-electrolyte interface. However, if minority carriers are injected into the semiconductor, a substantial number thereof will be drawn toward and collected at the semiconductor-electrolyte interface. This will cause a change in the surface potential such as to result in an increase in the current flow from the cell. Experience has shown that the current multiplication factor of the combination is the order of unity or larger, that is, each unit electronic charge collected by the germanium-electrolyte interface will cause one or more unit electronic charges to flow around the cell circuit. Further, as the alternating current impedance of the collector is high in comparison with the emitter impedance, power gain is realized. Also the energy for operation and this gain is derived from the electrochemical action. Thus, the combination constitutes a unitary self-powered translating device.

The injection of minority carriers may be effected through the agency of a light beam incident upon the semiconductor body, or of an emitter, for example of the point contact or alloy junction type. The emitter may be biased from an external source or from the cell aforementioned, for example by way of an appropriate resistor in the base lead.

Also, as has been indicated hereinabove, a second electrolyte and electrode may be provided in association with the semiconductor to produce minority carrier modulation and thus provide control of the current in the collector-base circuit. The second electrolyte and electrode may be associated to provide or augment the collector bias. As is known, the action of a collector derives from the fact that the impedance of a collector is dependent on the concentration of minority carriers in the semiconductor. The collector impedance can be increased or decreased by increasing or decreasing the minority carrier density. If the action at another contact is one of increasing the minority carriers above the concentration normally present when the semiconductor is in thermodynamic equilibrium this is generally thought of as injection. Reducing the concentration of minority carriers below the equilibrium value may be termed depletion. The important point is that the impedance of the collector can be modulated by changing the minority carrier concentration whether it is depletion or injection. A second point is that if the collector impedance is large enough and the modulation thereof large enough while the impedance through which the carrier concentration is changed or modulated is small enough then power gain can be achieved regardless of whether the process is depletion or injection. More specifically it has been found that an electrolytic contact can be used to modulate this minority carrier density in such a way as to in turn modulate the impedance of a collector and thus form a circuit translating device. One illustrative case of this involves two electrolytic contacts both biased as collectors competing for the minority carrier. If the current multiplicator factor $\alpha$, at each surface is slightly greater than one then this combination forms a device in which one collector is low impedance and the other high with respect to the base connection and a signal of appropriate sign and magnitude on one or the other of the collectors switches this device to the other extreme.

In general, the invention may be embodied in devices wherein the primary cell is included in either the input or output portions, or both. For example, the cell may be included in the collector circuit and the emitter may be of conventional form biased from either the cell or an external source. As another example, the cell may be included in the emitter circuit and the collector may be of conventional form and biased from either an external source or from the cell. Also, as indicated hereinabove, cells may be included in both the emitter and collector systems. Further, in another embodiment, the cells may be defined in part by the end zones of a junction transistor such as disclosed in Patent 2,569,347, granted September 25, 1951, the electrolyte or electrolytes being such as to form substantially ohmic connections to the end zone or zones.

The conditions under which the electrical properties of a semiconductor electrolyte interface are ohmic or rectifying may be set forth as follows. When a bias is applied in such a sense as to provide at the semiconductor surface a layer of ions of the same sign as the majority carrier in the semiconductor, the presence of such an ion layer tends towards the production of a surface (space charge) region in the semiconductor of conductivity type opposite to that of the body of the semiconductor. This condition is satisfied by an anodic bias on N type semiconductors, or a cathode bias on P type. In the bias direction aforementioned, current is known to flow in the semiconductor largely as minority carriers, so that the surface has rectifying properties. In the opposite bias direction (anodic on P type, cathodic on N type), current is known to flow largely as majority carriers, so that the contact is substantially ohmic. It should also be noted that there will be, in series with the contribution from the semiconductor to the interface impedance, an additional impedance arising from the properties of the ionic double layer. This additional impedance is low in the anodic direction for the case of germanium and an aqueous electrolyte, provided that the oxidation products are dissolved and not deposited as an insulating film. One way of accomplishing this is to arrange that the electrolyte shall be alkaline.

By employing the semiconductor as one electrode of a primary cell, one can arrange that the bias current necessary to make the semiconductor surface have the desired electrical properties be supplied without the requirement of an external power supply. The internal electromotive force of the cell will be the difference between the half-electrode potentials of the two electrodes, and the direction of current flow through a resistor connected across the terminals of the cell will depend on which half-electrode potential is higher. For example, if the half-electrode potential of the second electrode is lower than the potential at which the semiconductor passes reversibly into solution in oxidized form, then, by connecting a resistor between the terminals of the cell, a current will flow in such a sense as to bias the semiconductor anodically. This gives a rectifying contact to N type semiconductors, and a substantially ohmic contact to P type. If, on the other hand, the second electrode is less noble than the semiconductor, the electrolyte being such as to plate out the semiconductor, a current will flow in such a sense as to bias the semiconductor cathodically, giving a rectifying contact if the semiconductor is P type, but ohmic if it is N type.

The words "higher" and "lower," used in specifying the sign of a half-electrode potential, are taken to mean "less noble" and "more noble" respectively. The words "anode" and "cathode" refer to electrodes at which oxidation and reduction occur respectively.

The invention and the above noted and other features thereof will be understood more clearly and fully from the following detailed description with reference to the accompanying drawing in which.

Figure 4:
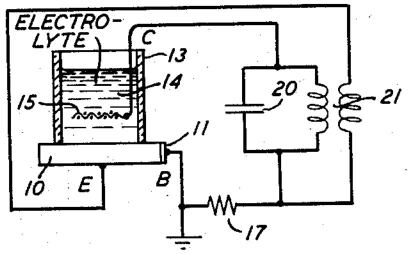
Figure 5:
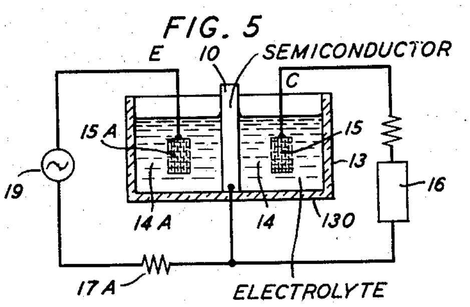
Figure 6:
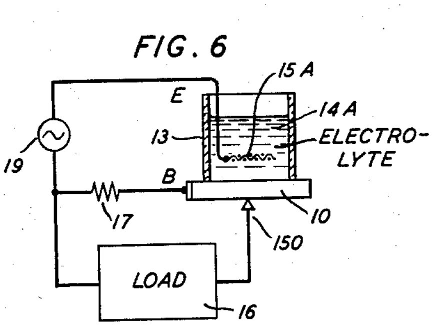
Figure 7:
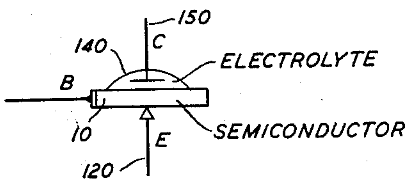
Figure 8:
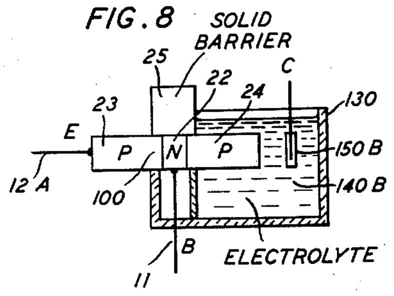
Figure 9:
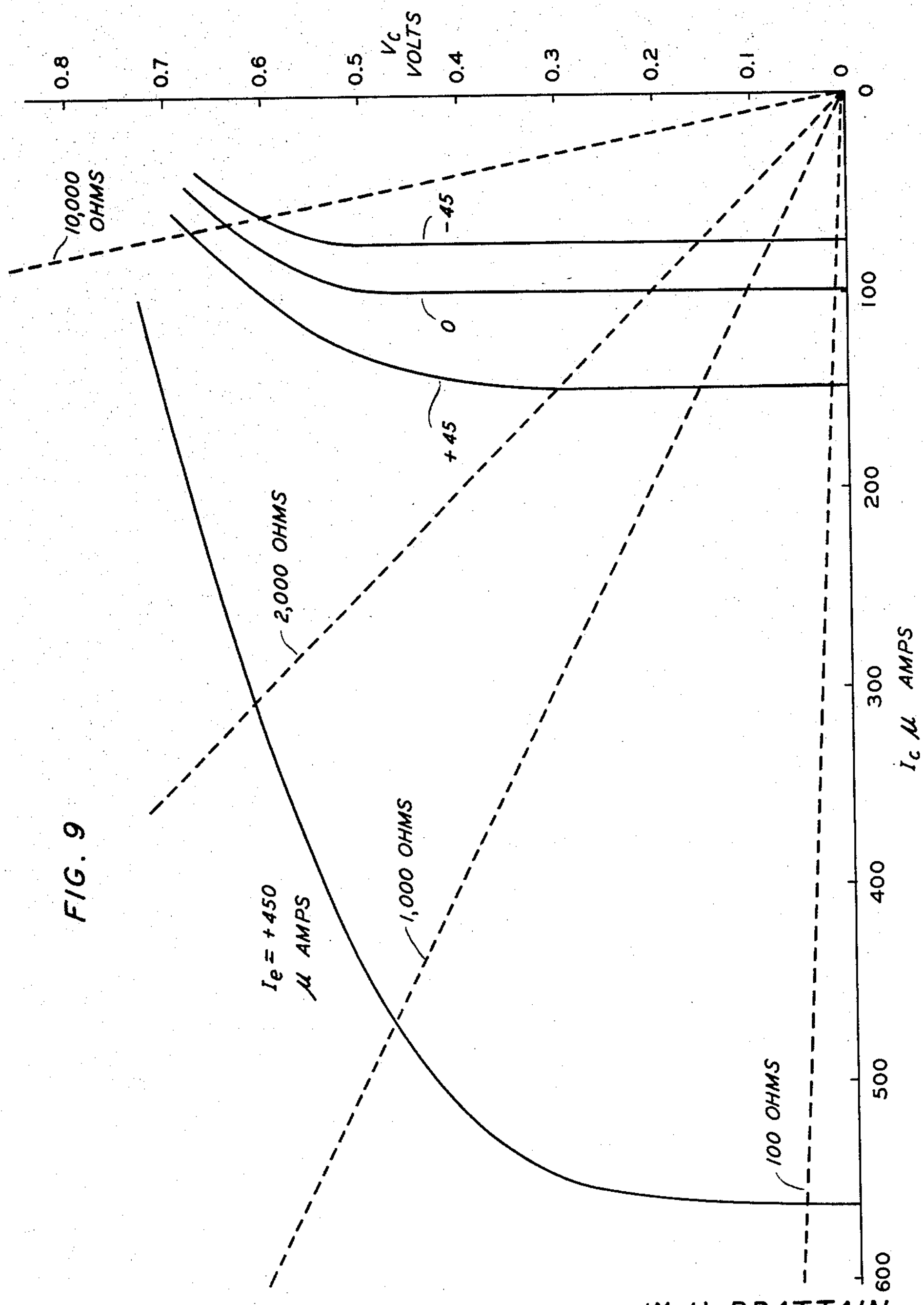

Fig. 4 portrays an oscillator including a translating device constructed in accordance with this invention;

Fig. 5 illustrates another embodiment wherein primary cells are included in both the emitter and collector portions of the device;

Fig. 6 portrays still another embodiment wherein the electrolytic cell is included in the emitter portion of the structure and a conventional collector is utilized;

Fig. 7 depicts a device constructed in accordance with this invention wherein a solid electrolyte is employed;

Fig. 8 illustrates an application of this invention to a junction transistor; and Fig. 9 is a graph representing performance characteristics of a collector junction constructed in accordance with this invention.

Figure 1:
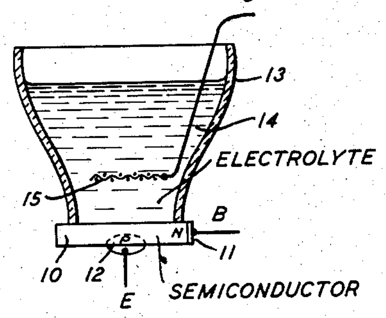
Fig. 1 is an elevational view partly in section of a semiconductor translating device illustrative of one embodiment of this invention.

Referring now to the drawing, the device illustrated in Fig. 1 comprises a wafer 10 of electronic semiconductive material, such as germanium or silicon, a substantially ohmic base connection 11 to the wafer, and an emitter connection to one face of the wafer. This connection may be of any one of several forms. In that depicted, the body is of N type and the emitter connection is fabricated by melting an acceptor, for example indium, in contact with the semiconductor thereby to form a P type zone 12 in the body.

Sealed to the opposite face of the wafer 10 is an enclosure 13, for example a section of glass tubing cemented to the wafer, which defines with the wafer a vessel containing an electrolyte 14 in which an electrode 15, constituting the output terminal, is immersed. For ready reference, the base, emitter and output or collector terminals are designated in Fig. 1 and other figures by the letters B, E and C respectively.

The electrolyte 14 together with the wafer 10 and the electrode 15 constitute a primary cell, the internal electromotive force of which is determined, of course, by the difference between the half potentials of the semiconductor and electrode material. In a typical construction, the wafer 10 was N conductivity type germanium, the electrode 15 was a silver-silver oxide mesh and the electrolyte a decinormal aqueous solution of potassium hydroxide. The internal electromotive force of the cell was about 0.6 volt and the polarity such as to bias the germanium anodically.

Further, the semiconductor-electrolyte junction is asymmetric and the reverse impedance is high. In the typical device above described, the alternating current impedance of the junction in the reverse direction was of the order of 100,000 ohms. The asymmetric characteristic may be attributed to the formation of an inversion layer, that is a P conductivity type layer, upon the face of the wafer in contact with the electrolyte. The formation of such inversion layer is explicable in the following manner: When the germanium is biased anodically, a layer of negative ions obtains on the surface whereby a positive space charge layer is created in the germanium. Thus, the energy levels are bent up relative to the Fermi level, sufficiently so to convert the surface of the N type semiconductor to P type. Once the inversion layer is formed, an increase in the biasing current reversely biases the junction between the P type surface layer and the N type bulk so that the differential resistance of the germanium electrolyte interface becomes very large.

Nominally, then, considering the wafer 10, electrolyte 14 and electrode 15 as a diode, the reverse saturation current of the junction above described represents the maximum which can flow through the cell. However, it has been found that the surface potential at the semiconductor electrolyte interface is amenable to controlled variation whereby enhanced current flow is realized. More specifically, it has been found that the junction is an efficient collector for minority carriers injected into the semiconductor and that controlled injection leads to controlled output accompanied by power gain.

Output or collector characteristics for the typical device above described, wherein the germanium wafer 10 was 10 mils thick and one-quarter inch square and the emitter was of the indium alloy type, are depicted in Fig. 9. The abscissae are collector current in microamperes, as measured in a resistance connected between the base 11 and electrode 15 and the ordinates are collector voltage, specifically the drop across the resistor. The several curves are for different emitter currents, i. e., the value of this in microamperes being indicated on each curve. The dotted lines are in effect, the load lines for different values of the resistor, the values being as indicated in the figure. The collector current, then, may be determined as a function of emitter current, along any load line.

It will be noted from Fig. 9 that the curves approach the abscissae axis substantially normal so that evidently the alternating current collector resistance is high, say 100,000 ohms or higher. Also the current gain of the device is substantially unity. A particularly suitable operating point is that with a bias resistor of 2,000 ohms. This value, of course, is small in comparison with the collector impedance, of the order of 100,000 ohms as indicated above, and, thus, is not conducive to optimum alternating current power transfer. However, a load can be coupled to the collector circuit through a suitable transformer so that effectively the load impedance is of the same magnitude as the collector impedance.

The collector impedance is high in comparison to the emitter impedance so that, bearing in mind that the current gain approaches unity, power gain is realized. For the typical device, at zero emitter current, power gain of about 20 decibels has been obtained. The gain is higher for forward biases in the emitter. The power to provide the gain is derived from the cell defined by the electrolyte, the semiconductor and the electrode 15.

It is to be remarked particularly that the translating operation involves only electrons and holes, both of high mobility. Changes in ion density, as at the semiconductor-electrolyte interface, do not affect the speed of operation. The electrolyte 14 and electrode 15 constitute, from one viewpoint, a connection to the collector junction at the semiconductor-electrolyte interface. Thus, high frequency operation is realizable.

Various other combinations of semiconductor, electrolyte and electrode other than that described specifically hereinabove may be used. Illustrative are:

| Semiconductor 10 | Electrolyte 14 | Electrode 15 |
|---|---|---|
| N type germanium<br>N type silicon | $H_2SO_4$<br>KCl<br>$NH_4Cl$ | Pb—$PbO_2$<br>$Hg_2Cl_2$—$HgCl_2$<br>$MnO_2$ |

Figure 2:
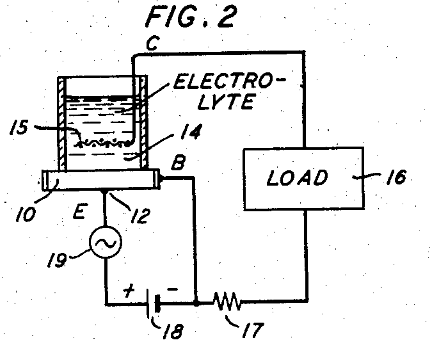
Figs. 2 and 3 depict amplifiers embodying the invention.
Figure 3:
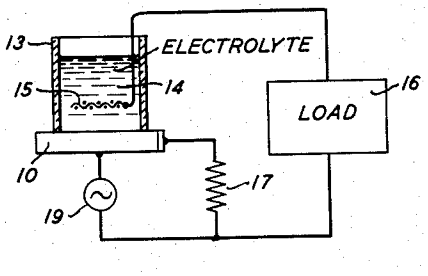

Typical amplifier circuits embodying translating devices constructed in accordance with this invention are represented in Figs. 2 and 3. In the former a load 16 which advantageously is transformer coupled for reasons discussed hereinabove is connected between the base 11 and electrode 15 in series with the biasing resistor 17. The emitter may be biased in the forward direction by a source 18 and signals impressed between the emitter and base 11 from a suitable source indicated at 19.

The amplifier of Fig. 3 is basically similar to that shown in Fig. 2. However, the emitter bias is derived from tapping to a suitable point on the base resistor 17.

Although in Figs. 2 and 3 the transistor is shown connected for operation in the so-called grounded base configuration it will be understood, of course, that the grouned emitter and grounded collector configurations also may be used.

The invention may be embodied also in oscillators, a typical form of which is portrayed in Fig. 4. As there shown, a frequency determining tuned circuit comprising the condenser 20 and the primary winding of a transformer 21 is connected between the base 11 and the electrode 15. The secondary winding of the transformer 21 is connected between the base 11 and the emitter.

As has been indicated hereinabove the electrolytic cell may be included in the input portion of the translating devices. A typical construction is shown in Fig. 5. The semiconductor wafter 10 is mounted edgewise in a vessel 130 and joined to three walls thereof in such manner as to divide the vessel into two compartments. An electrolyte 14 and electrode 15 are provided in one of the compartments and function in the same manner as in the embodiment illustrated in Fig. 1 and described in detail hereinabove. The other compartment has therein a second electrolyte 14A and a second electrodge 15A which together with the semiconductor 10 constitute a second electrolytic cell. A typical material for the electrolyte 14A is a decinormal aqueous potassium chloride and a typical material for the electrode 15A is silver-silver chloride. For such materials the cell has an internal electromotive force of approximately zero and the electrolyte semiconductor interface constitutes a means for modulating minority carrier concentration in the semiconductor as described hereinabove.

As illustrated in Fig. 6, an electrolytic cell may be provided only at the input side of the translating device, the collector being of any one of known forms such as a point contact 150. The cell may be utilized to provide an appropriate collector bias, or to augment a separate source providing such bias, through a base resistor 17.

Although in the embodiments thus far described liquid electrolytes have been mentioned, solid or gel electrolytes also may be employed. For example, as shown in Fig. 7, a mass 140 of Kieselguhr containing a suitable electrolyte, such as those previously recited herein, may be provided on one face of the semiconductor 10 and the electrode 150 of appropriate material embedded in the mass. The emitter connection may be of any one of a variety of forms, for example a point contact 120 as shown.

In the embodiment of the invention illustrated in Fig. 8, an electrolytic cell constituting a unitary part of the translating device and serving merely as a primary source for providing collector bias is shown. The transistor is of the junction type and comprises a semiconductor body 100 having a zone 22 of one conductivity type, for example N as shown, sandwiched between emitter and collector zones 23 and 24, respectively, of the opposite conductivity type. The body 100 is mounted in and extends through a wall 25 of the vessel 130 which contains an electrolyte 140B in which an electrode 150B is immersed. Ohmic connections 11 and 12A are made to the base and emitter zones 22 and 23, respectively.

The collector junction is reversely biased by the electrolytic cell defined by the zone 24, electrolyte 140B and electrode 150B, this electrode serving as the collector terminal. The electrolyte 150B forms a substantially ohmic connection to the collector zone 24. A typical combination, where the semiconductor is germanium, is an electrolyte 140B of sodium hydroxide solution and an electrode 150B of silver-silver oxide. Such provides a reverse bias of about 0.6 volt to the collector junction.

The emitter junction may be biased in the forward direction from a separate source; alternatively as in other embodiments heretofore described, it may be biased from the electrolytic cell through an appropriate biasing resistor.

What is claimed is:

1. A signal translating device comprising a body of semiconductive material selected from the groups consisting of germanium and silicon, a substantially ohmic connection to said body, a rectifying connection to said body, and means comprising said body, an electrolyte and an electrode in said electrolyte defining a primary cell, said electrolyte defining a rectifying junction with said body.

2. A signal translating device comprising a body of semiconductive material selected from the group consisting of germanium and silicon, a base connection to said body, means for modulating the minority carrier density in said body, and means for collecting minority carriers, said collecting means comprising an electrolyte in contact with a portion of said body and an electrode in said electrolyte.

3. A signal translating device comprising a body of semiconductive material selected from the group consisting of germanium and silicon, a substantially ohmic connection to said body, means for collecting minority carriers from said body, and means comprising said body, an electrode spaced therefrom and an electrolyte between said body and electrode defining an electrolytic cell poled to induce flow of minority carriers to the semiconductor-electrolyte interface.

4. A signal translating device in accordance with claim 3 wherein said body is of N conductivity type material and is biased anodically by said cell.

5. A signal translating device in accordance with claim 3 wherein said body is of P conductivity type material and is biased cathodically by said cell.

6. A signal translating device comprising a body of semiconductive material selected from the group consisting of germanium and silicon, a substantially ohmic connection to said body, means for controlling minority carrier density in said body comprising an electrolyte in contact with said body and an electrode in said electrolyte, and a collector connection to said body.

7. A signal translating device in accordance with claim 6 wherein said body is of N conductivity type and is a material having a position higher in the electromotive series than the material of said electrode.

8. A signal translating device in accordance with claim 6 wherein said body is of P conductivity type and is a material having a position lower in the electromotive series than the material of said electrode.

9. A signal translating device comprising a body of semiconductive material, a base connection to said body, means for controlling minority carrier density in said body comprising a first electrode and a first electrolyte in contact with said body and electrode, and means for collecting said minority carriers comprising a second electrode and a second electrolyte in contact with said body and said second electrode.

10. A signal translating device in accordance with claim 9 wherein said first electrode, first electrolyte and body define a primary cell poled to bias the interface between the body and the first electrolyte in the forward direction, and wherein said second electrode, second electrolyte and body define a cell poled to bias the interface between the body and the second electrolyte in the reverse direction.

11. A signal translating device comprising a body of semiconductive material, a base connection to said body, an input circuit comprising said base connection, an electrode and an electrolyte wherein the current path through said base connection, said body, said electrolyte and said electrode includes a rectifying barrier between said body and electrode, and an output circuit comprising said base connection, a second electrode and a second electrolyte between said body and said second electrode wherein the current path through said base connection, said body, said electrolyte and said second electrode includes a rectifying barrier, said first and second electrolytes being physically isolated from each other.

12. A signal translating device comprising a wafer of N type germanium, a base connection to said wafer, an emitter connection to said wafer, an electrode opposite said wafer, and an electrolyte capable of producing a P type surface layer on said wafer between and in contact with said electrode and a portion of said wafer spaced from said emitter and base connections.

13. A signal translating device comprising a wafer of P type germanium, a base connection to said wafer, an emitter connection to said wafer, an electrode spaced from said wafer, and an electrolyte capable of producing an N type surface layer on said wafer between and in contact with said electrode and a portion of said wafer spaced from said base and emitter connections.

14. A semiconductor device comprising a body of semiconductive material selected from the group consisting of germanium and silicon, an electrode spaced from said body, an electrolyte between and in contact with said body and electrode and defining a primary cell therewith, said electrolyte and body forming an asymmetric junction at the interface thereof, and means for controlling the reverse current across said junction.

15. A semiconductor device in accordance with claim 14 wherein said semiconductive material is N conductivity type germanium, said electrolyte is an aqueous solution of potassium hydroxide, and said electrode is of a material having a half-electrode potential lower than that at which germanium passes into said solution.

16. A semiconductor device in accordance with claim 15 wherein said electrode is of silver-silver oxide.

17. A signal translating device comprising a body of semiconductive material, base and emitter connections to said body, an input circuit connected between said base and emitter connections, an electrolyte in contact with a portion of said body spaced from said base and emitter connections and defining a collector with said portion, an electrode in said electrolyte, said body, electrolyte and electrode defining a primary cell of polarity to bias said collector in the reverse direction, and a load circuit connected between said electrode and said base connection.

18. A semiconductor device including in combination a body of semiconductor material, a rectifying electrode in contact with said body and an electrochemical power source including said body as one electrode element thereof.

19. A semiconductor device including a body of semiconductor material, a rectifying electrode in contact with said body and an electrochemical power source including said body as one electrode element thereof, and means connecting said power source to said rectifying electrode.

20. A semiconductor device including a body of semiconductor material, a rectifying electrode in contact with said body, and an electrochemical cell including said body as one electrode element thereof, said cell including an electrolyte and a body of material occupying a different position in the electrochemical series than said semiconductor material, and means connecting said cell to said electrode.

21. A signal translating device comprising a body of semiconductor material, a base connection to said body, means for collecting minority carriers from said body, said collecting means comprising an electrolyte in contact with a portion of said body and an electrode in said electrolyte, and means for modulating the minority carrier density in said body, said means comprising a second electrolyte in contact with said body and an electrode in said second electrolyte.

References Cited in the file of this patent

UNITED STATES PATENTS

| | | |
|---|---|---|
| 2,524,034 | Brattain | Oct. 3, 1950 |
| 2,556,286 | Meacham | June 12, 1951 |
| 2,569,347 | Shockley | Sept. 25, 1951 |
| 2,713,644 | Rappaport | July 19, 1955 |